United States Patent
Potok et al.

(10) Patent No.: US 8,064,273 B2
(45) Date of Patent: Nov. 22, 2011

(54) MEMORY DEVICE AND METHODS THEREOF

(75) Inventors: Ronald M. Potok, Austin, TX (US); Matthew L. Thayer, Austin, TX (US)

(73) Assignee: Globalfoundries Inc.

( * ) Notice: Subject to any disclaimer, the term of this patent is extended or adjusted under 35 U.S.C. 154(b) by 382 days.

(21) Appl. No.: 12/251,509

(22) Filed: Oct. 15, 2008

(65) Prior Publication Data

US 2010/0091584 A1 Apr. 15, 2010

(51) Int. Cl.
*G11C 7/06* (2006.01)
(52) U.S. Cl. ............... 365/189.07; 365/191; 365/185.03
(58) Field of Classification Search ............. 365/189.07, 365/191, 185.03, 207, 210, 185.2, 154, 203, 365/244, 185.01
See application file for complete search history.

(56) References Cited

U.S. PATENT DOCUMENTS

| | | | | |
|---|---|---|---|---|
| 4,868,823 A | * | 9/1989 | White et al. | 714/720 |
| 5,523,970 A | * | 6/1996 | Riggio, Jr. | 365/185.01 |
| 5,933,366 A | * | 8/1999 | Yoshikawa | 365/185.03 |
| 6,005,793 A | * | 12/1999 | Tran | 365/154 |
| 6,069,821 A | * | 5/2000 | Jun et al. | 365/185.21 |

* cited by examiner

*Primary Examiner* — Dang Nguyen

(57) ABSTRACT

A memory device is disclosed that includes multiple bit cells, whereby each bit cell is capable of being programmed to more than two states. A value stored at the memory device is determined by comparing the information stored at three or more of the bit cells. In an embodiment, the bit cell includes a silicon-on-insulator (SOI) metal oxide semiconductor field effect transistor (FET) device, and the information stored at the bit cell can be represented by a corresponding level of charge stored in the body of the device.

19 Claims, 4 Drawing Sheets

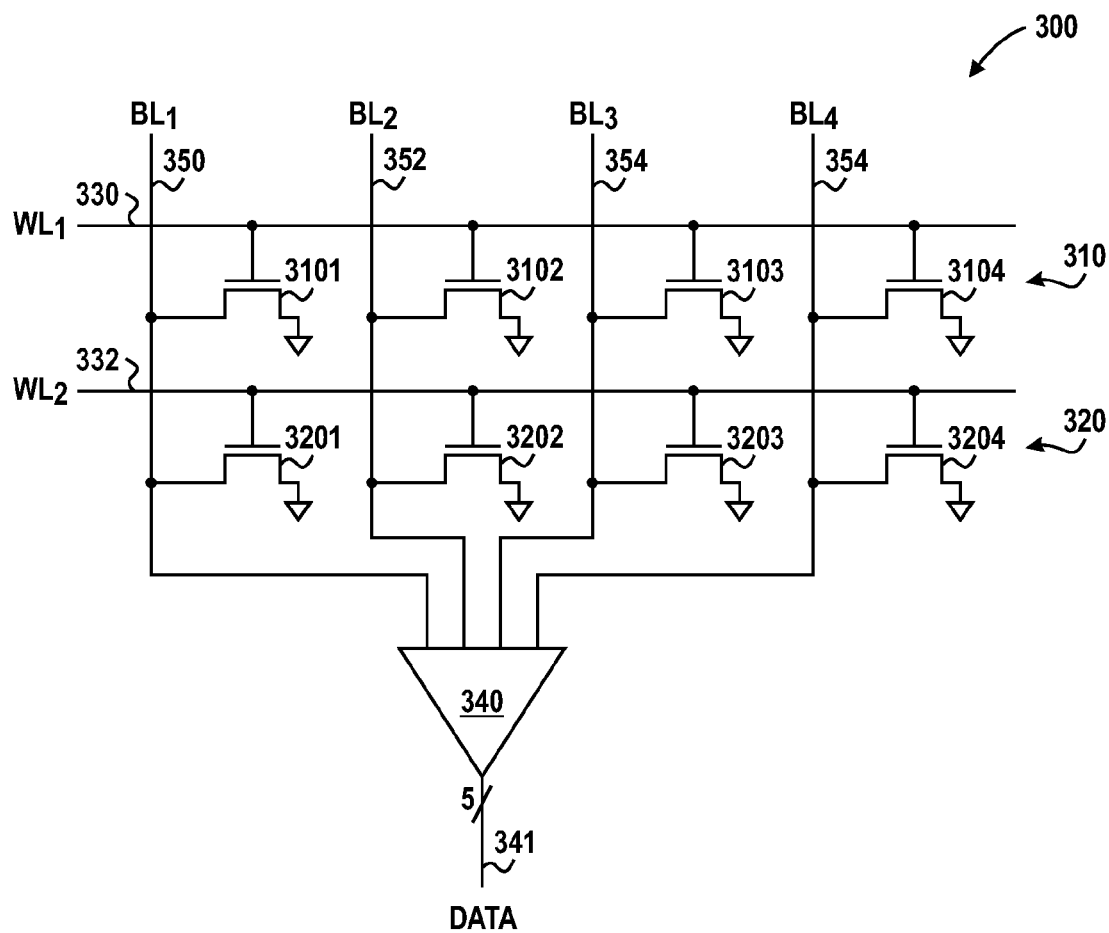

US 8,064,273 B2

MEMORY DEVICE AND METHODS THEREOF

BACKGROUND

1. Field of the Disclosure

The present disclosure relates generally to electronic devices, and more particularly to memory devices.

2. Description of the Related Art

Many integrated circuit devices employ memory devices to store data. The memory devices are typically composed of bit cells, with each bit cell storing a bit of data. In order to read the value of data stored at a bit cell, a signal generated by the bit cell in response to application of a read voltage is compared at a sense amplifier to a reference signal provided by a reference device. However, binary bit cells can require an undesirable amount of integrated circuit substrate area to store a large amount of data. Thus, providing greater memory capacity for a specific size of substrate can be advantageous.

BRIEF DESCRIPTION OF THE DRAWINGS

The present disclosure may be better understood, and its numerous features and advantages made apparent to those skilled in the art by referencing the accompanying drawings.

FIG. 2 includes a combined block and tabular illustration of a memory cell and corresponding state values in accordance with a specific embodiment of the present disclosure.

FIG. 3 includes a combined block and schematic illustration of a portion of the memory array of FIG. 1 in accordance with a specific embodiment of the present disclosure.

The use of the same reference symbols in different drawings indicates similar or identical items.

DETAILED DESCRIPTION

A memory device is disclosed that includes multiple bit cells, whereby each bit cell is capable of being programmed to more than two states. A value stored at the memory device is determined by comparing the information stored at three or more of the bit cells. In an embodiment, the bit cell includes a field effect transistor (FET) device formed at a substrate, such as a silicon-on-insulator (SOI) substrate or a bulk semiconductor substrate, and the information stored at the bit cell can be represented by a corresponding level of charge stored in the body of the device.

Figure 1:
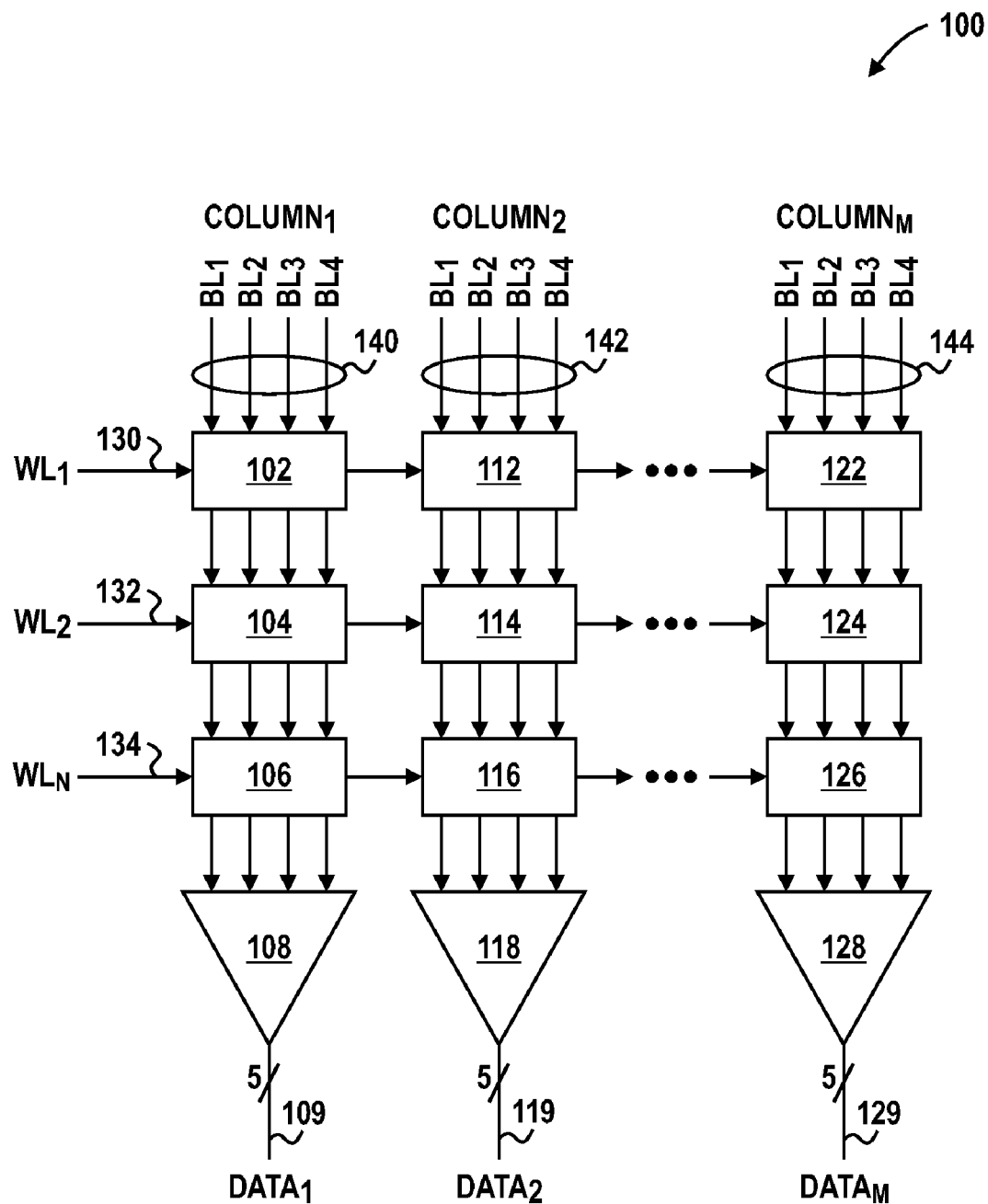
FIG. 1 includes a block diagram illustrating a memory array in accordance with a specific embodiment of the present disclosure.

FIG. 1 includes a block diagram illustrating a portion of memory array 100 including memory cells 102, 104, 106, 112, 114, 116, 122, 124, and 126, and comparators 108, 118, and 128. Memory cells 102, 104, and 106, and comparator 108 each has four inputs connected to bit line bus 140, labeled "COLUMN$_1$." Memory cells 112, 114, and 116, and comparator 118 each has four inputs connected to bit line bus 142, labeled "COLUMN$_2$." Memory cells 122, 124, and 126, and comparator 128 each has four inputs connected to bit line bus 144, labeled "COLUMN$_M$." COLUMN$_1$, COLUMN$_2$, and COLUMN$_M$ each include four individual bit lines, labeled "BL$_1$", "BL$_2$", "BL$_3$", and "BL$_4$", respectively. Memory cells 102, 112 and 122 have an input to receive a word line 130, labeled "WL$_1$." Memory cells 104, 114 and 124 each have a corresponding input connected to a word line 132, labeled "WL$_2$." Memory cells 106, 116 and 126 each have a corresponding input connected to a word line 134, labeled "WL$_N$." Comparator 108 has an output connected to a five-bit data bus 109, labeled "DATA$_1$." Comparator 118 has an output connected to a five-bit data bus 119, labeled "DATA$_2$." Comparator 128 has an output connected to a five-bit data bus 129, labeled "DATA$_M$."

Memory array 100 illustrates three word lines and three columns, but represents an array of arbitrary dimension with "M" bit line columns, "N" word lines, and "M" data buses. An individual memory cell can be accessed via a write access operation to store information and via a read access operation to retrieve information. The memory cell is accessed by asserting signals on the word line and bit line bus corresponding to the memory cell. For example, memory cell 102 can be accessed by asserting a signal on word line 130 and bit line column 140. All memory cells connected to a particular word line can be accessed in parallel. For example, memory cells 104, 114, and 124 can be accessed by asserting a signal on word line 132 and bit line busses 140, 142 and 144.

Information can be stored at a memory cell by performing a write access operation. During a write access operation, a memory cell is programmed by asserting a signal on its corresponding word line, and by asserting individual signals on its corresponding bit lines, so that the memory cell is programmed to one of a plurality of possible states. For example, each memory cell, such as memory cell 102, can contain four individual bit cells. Each bit cell can be programmed to four possible states to store information. In a specific embodiment of the present disclosure, each FET of the four states can correspond to a particular level of charge stored in the body of a FET formed at an SOI FET substrate when compared to associated devices. By programming each individual bit cell to a unique state, the memory cell is programmed to a designated state. This can be better understood with reference to FIG. 2.

FIG. 2 includes a combined block and tabular illustration 200 of a memory cell, and a corresponding state stored at individual bit cells of the memory cell, in accordance with a specific embodiment of the present disclosure. FIG. 2 includes a memory cell 210. Memory cell 210 can represent a memory cell at FIG. 1, such as memory cell 102. Memory cell 210 includes four bit cells 2101, 2102, 2103, and 2104. Illustrated below each bit cell are four examples, labeled EXAMPLE1 through EXAMPLE4, of states that can be stored at the corresponding bit cell. The illustrated states include "1, 2, 3, 4", "2, 1, 3, 4", "4, 2, 3, 1", and "4, 3, 2, 1."

EXAMPLE1 illustrates that bit cell 2101 is programmed to state "1", bit cell 2102 is programmed to state "2", bit cell 2103 is programmed to state "3", and bit cell 2104 is programmed to state "4." EXAMPLE2 illustrates that bit cell 2101 is programmed to state "2", bit cell 2102 is programmed to state "1", bit cell 2103 is programmed to state "3", and bit cell 2104 is programmed to state "4." EXAMPLE3 illustrates that bit cell 2101 is programmed to state "4", bit cell 2102 is programmed to state "2", bit cell 2103 is programmed to state "3", and bit cell 2104 is programmed to state "1." EXAMPLE4 illustrates that bit cell 2101 is programmed to state "4", bit cell 2102 is programmed to state "3", bit cell 2103 is programmed to state "2", and bit cell 2104 is programmed to state "1." No two bit cells are programmed to the same state.

Each unique bit cell order can encode and represent a unique memory value. For example, a memory cell containing four bit cells can encode 24 unique data values, where each bit cell programmed to one of four states, and with no two bit cells at the same state, using the rank encoding/decoding method described herein. In another embodiment, a memory cell can include five bit cells, and each bit cell can be programmed to one of five states. Such a memory cell can encode 120 data values. In contrast, a memory cell containing five bit cells, each programmed to one of two binary states, can encode only 32 data values. Thus, in the illustrated embodiment, the number of data values that can be encoded by N bit cells and N states is equal to N-factorial, providing for increased storage capacity in the bit cells.

Referring again to FIG. 1, during a read access operation, a signal is asserted on the word line associated with the accessed memory cell. In response, the output bit lines of the cell each provide a signal indicative of the state of the corresponding bit cell. For example, when memory cell 106 is read, each of bit lines $BL_1$, $BL_2$, $BL_3$, and $BL_4$ of bit line bus 140 convey the information stored at memory cell 106 to comparator 108. The information stored at memory cell 106 is provided at data bus 109.

Comparator 108, 118, and 128 are rank comparators. For example, comparator 108 can rank signals received from bit lines $BL_1$, $BL_2$, $BL_3$, and $BL_4$ of bit line column 140 based upon a voltage or current signal conducted by each bit line, the voltage or current signal indicative of an amount of body charge at a corresponding bit cell of a particular memory cell that is accessed. A rank comparator can identify the magnitude of each voltage or current and determine an order, ascending or descending, based upon the relative magnitude at each bit line. The determined order can represent a particular encoding of a memory value stored at a memory cell.

FIG. 3 includes a combined block and schematic illustration of a memory array 300, representing a portion of memory array 100 of FIG. 1, in accordance with a specific embodiment of the present disclosure. Array 300 includes memory cells 310 and 320, a comparator 340, a word line 330, labeled "$WL_1$", a word line 332, labeled "$WL_2$", a bit line 350, labeled "$BL_1$", a bit line 352, labeled "$BL_2$", a bit line 354, labeled "$BL_3$", and a bit line 356, labeled "$BL_4$." Memory cell 310 includes four bit cells, implemented as transistors 3101, 3102, 3103, and 3104. Memory cell 320 includes four bit cells, implemented as transistors 3201, 3202, 3203, and 3204.

Word line 330 is connected to the gate terminal of transistors 3101, 3102, 3103, and 3104. Word line 332 is connected to the gate terminal of transistors 3201, 3202, 3203, and 3204. Bit line 350 is connected to a first source/drain (S/D) terminal of transistors 3101 and 3201, and to a first input of comparator 340. Bit line 352 is connected to a first S/D terminal of transistors 3102 and 3202, and to a second input of comparator 340. Bit line 354 is connected to a first S/D terminal of transistors 3103 and 3203, and to a third input of comparator 340. Bit line 356 is connected to a first S/D terminal of transistors 3104 and 3204, and to a fourth input of comparator 340. A second S/D terminal of each of transistors 3101, 3102, 3103, 3104, 3201, 3202, 3203, and 3204 is connected to a ground voltage supply. Comparator 340 has an output to provide a five-bit data bus 341, labeled "DATA."

Array 300 can represent a portion of array 100 at FIG. 1. For example, memory cell 310 can represent memory cell 102, and memory cell 320 can represent memory cell 104, and comparator 340 can represent comparator 108. Information can be stored and subsequently retrieved from memory cell 310 and 320 using state combinations such as those illustrated at FIG. 2.

In a specific embodiment, each of transistors 3101, 3102, 3103, 3104, 3201, 3202, 3203, and 3204 can include SOI FET devices. The body of a SOI FET device can be charged by applying a suitable voltage or current to the gate terminal and the first S/D terminal of the device for a particular amount of time. The amount of charge, corresponding to the state desired, is dependent upon the specific values of the gate and S/D voltages or currents, and how long the voltages or currents are applied. The body of all four transistors of a memory cell can be charged simultaneously, and to unique states, by appropriately configuring the corresponding word line and each bit line. This can be better understood with reference to FIG. 4.

Figure 4:
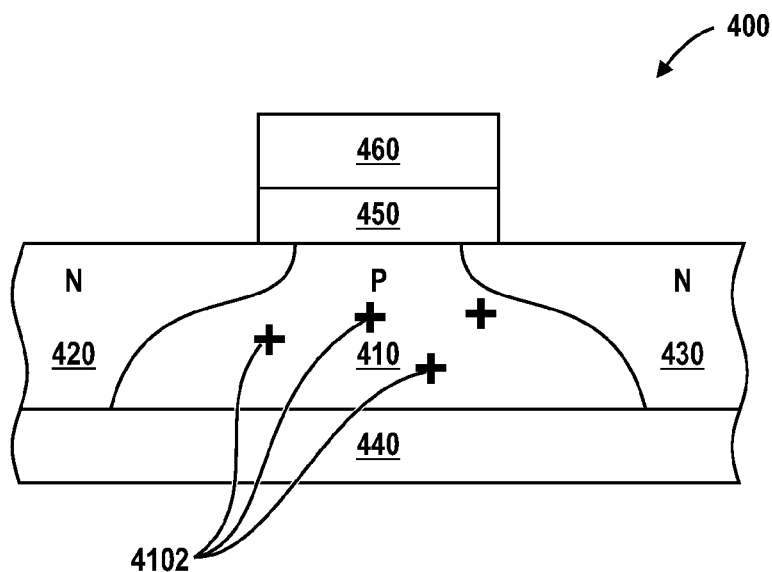
FIG. 4 includes a cross-sectional view of a bit cell in accordance with a specific embodiment of the present disclosure.

FIG. 4 includes a cross-sectional view of a bit cell 400, corresponding to bit cell 3101 at FIG. 3, in accordance with a specific embodiment of the present disclosure. Bit cell 400 includes a p-type body 410, an n-type S/D region 420, another n-type S/D region 430, an insulating layer 440, a gate oxide 450, and a gate 460. Body 410 includes charge 4102.

Bit cell 400 can include a partially or fully depleted SOI FET transistor, such as used in zero capacitor RAM (Z-RAM) bit cells. The FET illustrated is an N-type device. Because body 410 is electrically floating, insulated from the device substrate by insulating layer 440, body 410 can be charged by hot carrier injection or other mechanisms. Hot carrier injection creates electron-hole pairs, and the holes "fall" into body 410, thus charging the body 410 to a net-positive charge. The body 410 is formed to reduce leakage of charge contained in body 410 into the S/D regions. Thus, body 410 can be charged, and the charge will remain trapped at body 410 for a period of time. An N-type FET device is illustrated, but a P-type FET can be used to implement bit cell 400 if suitable electrical characteristics are achieved.

Body 410 of bit cell 400 can be charged to varying levels. A specific absolute amount, threshold, or range of body charge can correspond to a specific state. In this case, the body charge at each individual bit cell can be compared to a fixed reference to determine the state of the memory cell. A memory array using an absolute technique would provide greater information storage density than the ranking comparator technique disclosed herein. However, the ranking comparator technique provides certain advantages when compared to the absolute technique. Because charge at body 410 can decay over time, the techniques disclosed determines the state of a memory cell by comparing the body charge of one bit cell with that of associated bit cells that are charged at substantially the same time. Because the charge in all bit cells associated with a memory cell decay at substantially the same rate, the ratio of charge stored in each bit cell, relative to the associated bit cells, remains substantially the same.

For example, transistors 3101, 3102, 3103, and 3104 at FIG. 3 represent individual bit cells of memory cell 310, and the body of each is initially charged to one of four different levels, no two bit cells having the same level of charge. The different charges, rank encoded, represent a stored value. The body charge of each bit cell can decay at substantially the same rate. At a particular time, up until the body charges decay excessively, comparator 340 can rank the state of the bit cells and access the originally stored information. This may be better understood with reference to FIG. 5.

Figure 5:
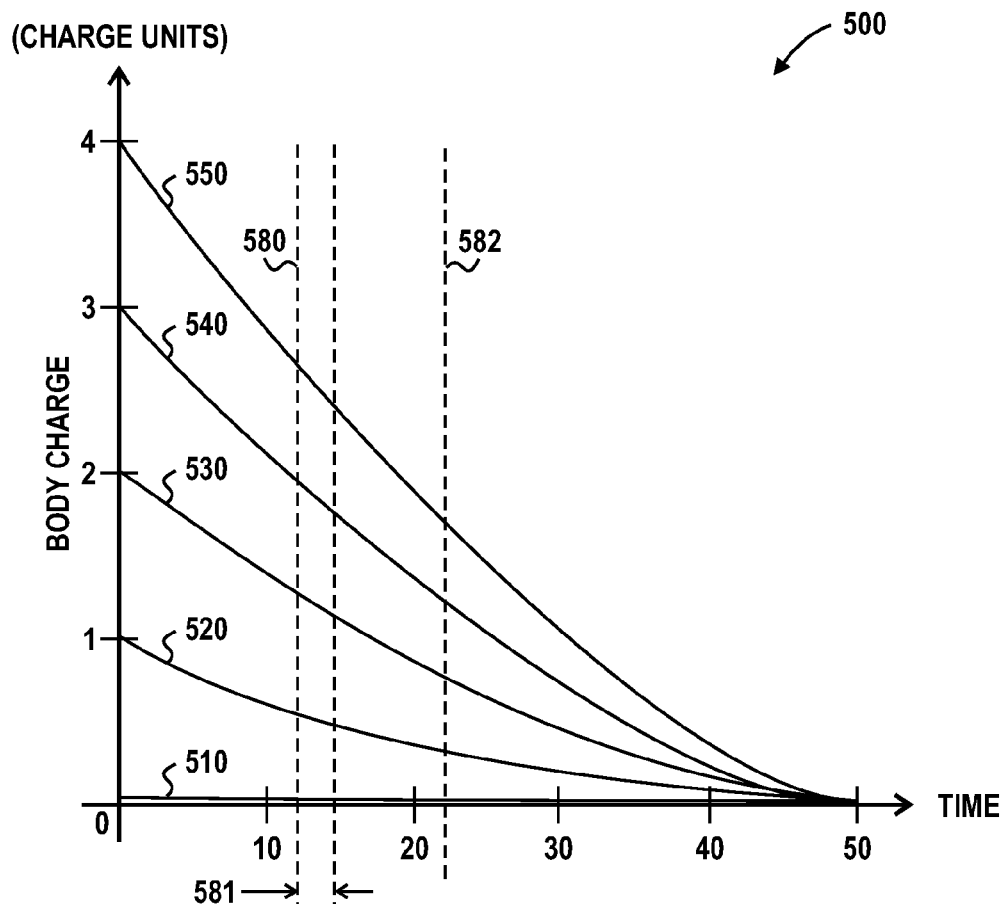
FIG. 5 includes a graph illustrating bit cell body charge as a function of time in accordance with a specific embodiment of the present disclosure.

FIG. 5 includes a graph 500 illustrating memory cell body charge as a function of time in accordance with a specific embodiment of the present disclosure. The horizontal axis of graph 500 represents time, and the vertical axis a level of body charge, expressed as arbitrary units of charge. Graph 500 includes curves 510, 520, 530, 540, and 550, time references 580 and 582, and duration 581. Arbitrary units of charge represent a relative relationship between body charges rather than a specific quantity of charge, and the relative relationship may be a non-linear relationship. For example, the vertical axis may be logarithmic or exponential.

Curves 510-550 represent five bit cells of a memory cell, similar to memory cell 102 at FIG. 1 and memory cell 310 at FIG. 3, but including five individual bit cells. The body of each bit cell can be charged to five unique levels, representing five unique states. The bit cell represented by curve 510 is initially uncharged, the body containing substantially no charge, and representing a first state. The bit cell represented by curve 520 is initially charged to a level of one charge unit, representing a second state. The bit cell represented by curve 530 is initially charged to a level of two charge units, representing a third state. The bit cell represented by curve 540 is initially charged to a level of three charge units, representing a fourth state. The bit cell represented by curve 550 is initially charged to a level of four charge units, representing a fifth state. A memory cell with five bit cells, and with each bit cell containing a unique level of charge, or state, can encode 120 different unique values of information.

As time elapses, the charge contained in the body of each bit cell can decay, slowly discharging until substantially no charge remains. However, the body charge of any bit cell, expressed as a ratio to the associated bit cells of a memory cell, remains substantially constant. For example, at time 580, a ranking comparator, ranking the relative charge contained in the body of each bit cell, will provide the same ranking that would be obtained at time 582, which is the same ranking that would be obtained when the bit cells were originally charged. Thus, the same information that was originally stored in the memory cell can be recovered even as the body charge at each bit cell partially decays. In an embodiment, the ranking comparator ranks the state at each bit cell substantially simultaneously, or completes the ranking sequentially in a short enough interval of time such that the charge in a particular bit cell does not decay below the charge at an associated bit cell during the interval that the sequential ranking is performed. Duration 581 illustrates an interval of time during which the sequential ranking can be performed where no one bit cell has decayed to an extent that alters the relative ranking of the bit cells. Thus, for example, at the end of duration 581 the charge level for the bit cell represented by curve 550 is greater than the charge level for the bit cell represented by the curve 540 at the beginning of the duration 581. Accordingly, even if the specific time a bit cell charge is read during duration 581 is unknown, the relative amount of that charge compared to the charge provided by other bit cells remains unchanged.

Because the charge at the body of a bit cell can decay, information stored at each bit cell can be periodically refreshed before the body charge at that bit cell decays to an excessive degree. All bit cells of a memory cell can be refreshed following each read access operation that accesses that memory cell, because the act of reading a bit cell can change the level of body charge at the bit cell. Refreshing a bit cell refers to re-writing the same state that was previously stored in the bit cell back into that bit cell. All bit cells of a particular memory cell can be refreshed substantially simultaneously. The decay of body charge can be concentration dependent so that the rate of decay is faster when the level of charge in the body is greater.

Referring again to FIG. 3, the body of transistor 3101 can be charged to a particular level by configuring word line 330 to a specific voltage, configuring bit line 350 to a specific voltage, and maintaining these values for a suitable period of time. Thus, more charge can be provided to the body of the transistor by maintaining the gate and S/D voltages for a longer period of time. The amount of charge provided to the body of the transistor can also be controlled by maintaining the gate and S/D voltages for the same amount of time, and varying the value of one or both of the gate and S/D voltages. Thus, more charge that can be provided to the body of the transistor by increasing one or both of the gate and S/D voltages. Still another technique for controlling the amount of body charge can include controlling the gate and S/D currents and the period of time that one or both currents is maintained. It can be necessary to substantially discharge the body charge at a bit cell prior to programming the bit cell to a particular state. A bit cell can be erased by setting the gate of the bit cell to a zero volt potential and setting the corresponding bit line to either a negative potential, forward biasing the D/S-Body junction, or to a high positive potential, to remove the body charge.

A memory value that is stored at a memory cell can be read by determining the state of the associated bit cells. One technique for reading a memory cell is based upon the fact that the threshold voltage of the associated bit cell transistors are inversely correlated to the amount of charge at the corresponding body of each transistor. The threshold voltage of a transistor can determine the degree of conductivity of that transistor when the terminals of the transistor are appropriately configured. The degree of conductivity of the transistor can be used to provide a corresponding voltage or current, the magnitude of the voltage or current positively correlated to the degree of conductivity.

For example, memory cell 310 can be read by first precharging bit lines 350-356, while maintaining word line 330 at a ground potential. The bit lines are precharged by applying a suitable voltage source to the bit lines for a period of time and removing the voltage source, allowing the bit lines to float. A moderate voltage (e.g. a voltage within the range of possible threshold voltages for the transistors associated with the memory cell 310) can be applied to word line 330 for a suitable period of time. Depending upon the amount of charge present at the body of each of bit cells 3101-3104, a corresponding amount of charge will be discharged from the bit line, resulting in a reduced bit line voltage. A bit cell with a greater body charge will have a proportionally lower threshold voltage, and therefore a greater amount of charge will be discharged from the corresponding bit line. Thus, the reduced voltage at each bit line corresponds directly to which of the four states the corresponding bit cell was previously programmed. Comparator 340 ranks the resulting bit line voltages and provides a representation of the value stored at memory cell 310 at bus 341. In a specific embodiment, comparator 340 can provide a binary representation of the stored information. Skilled artisans will understand that the information encoded and stored at memory array 300 can be decoded or further encoded as desired.

Another technique for reading a memory cell includes elevating bit lines 350-356 to a substantially small voltage (in an embodiment, on the order of 0.1 volts) using bit line voltage sources. The voltage on word line 330 is elevated to a value substantially similar to the transistor's threshold voltage. Comparator 340 can rank the currents supplied by the bit line voltage sources, the magnitude of the current of an individual bit line voltage source being directly correlated to the state value stored at the corresponding bit cell. Comparator 340 can also rank the currents supplied by the bit line voltage sources by sensing a voltage drop across a respective resistor (not shown) that is in series with each corresponding voltage source.

Figure 6:
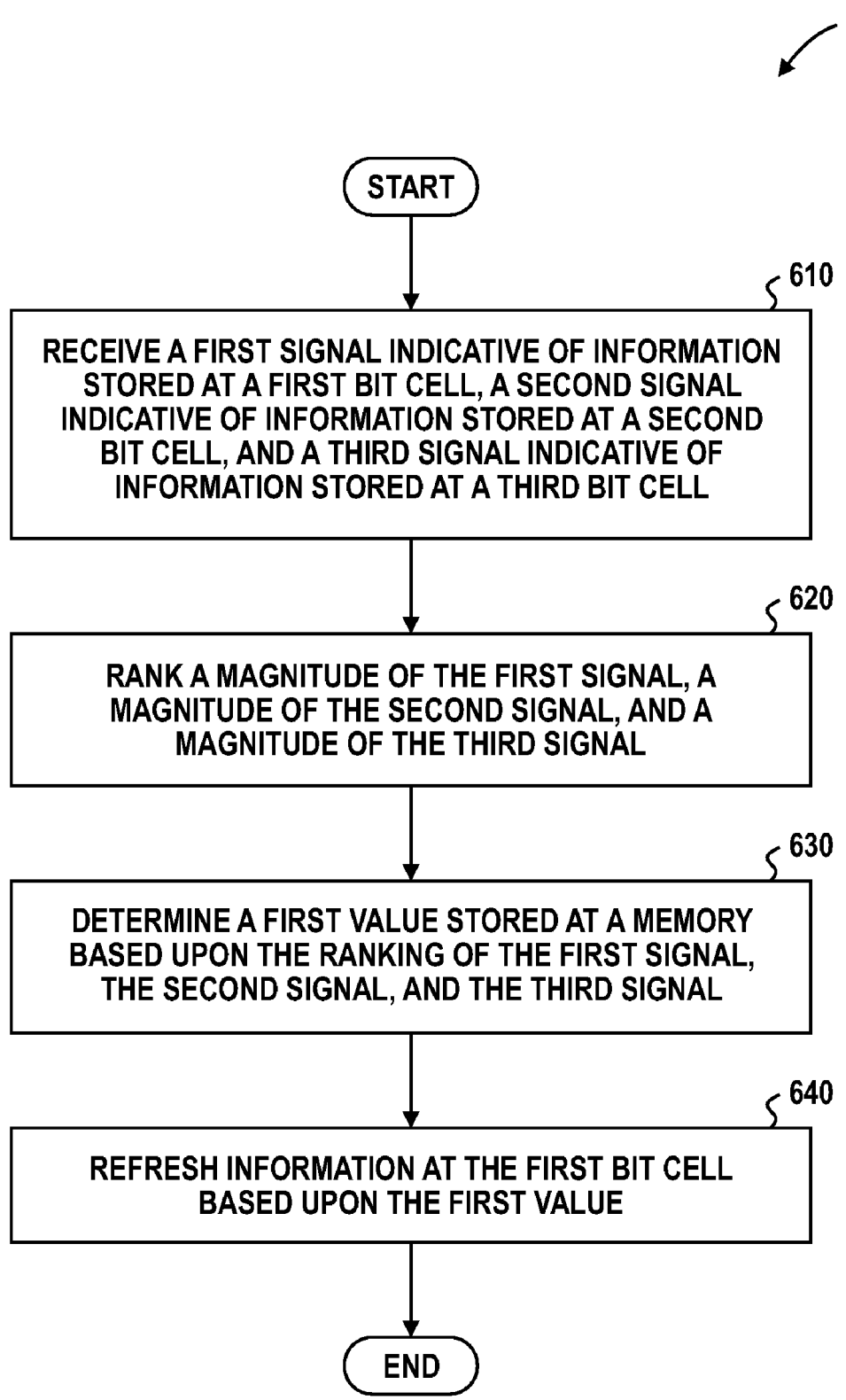
FIG. 6 includes a flow diagram of a method in accordance with a specific embodiment of the present disclosure.

FIG. 6 includes a flow diagram of a method 600 illustrating a read access operation of a memory cell, such as memory cell 102 at FIG. 1, in accordance with a specific embodiment of the present disclosure. At block 610, a first signal indicative of information stored at a first bit cell, a second signal indicative of information stored at a second bit cell, and a third signal indicative of information stored at a third bit cell, are received at a comparator, such as comparator 340 at FIG. 3. At block 620, the comparator performs a ranking of a magnitude of the first signal, a magnitude of the second signal, and a magnitude of the third signal. At block 630, a first value stored at a memory is determined based upon the ranking of the first signal, the second signal, and the third signal. At block 640, information at the first bit cell is refreshed based upon the first value.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, the bit cells at FIG. 3 are illustrated as FET devices, and explicitly SOI FET devices wherein state information corresponds to a particular level of charge stored in the body of the SOI FET device when compared to an associated devices. However, other bit cell implementations are possible, such as a traditional dynamic random access memory (DRAM) FET bit cell that includes an associated discrete capacitor to store charge to determine the state of the bit cell. In other embodiments, the bit cells can be non-volatile bit cells, such as flash memory bit cells.

Techniques for reading a bit cell described herein are based upon the fact that the threshold voltage of the bit cell transistor is inversely correlated to the amount of charge at the body of the transistor. The amount of charge at the body of the bit cell transistor can also affect the characteristics of an intrinsic bipolar junction transistor (BJT), where one S/D region is an emitter, the other S/D region is a collector, and the body is a base. The BJT characteristics can be used to determine the state stored at a bit cell using an appropriate comparator and associated bit line and word line configuration.

Techniques and procedures for designing circuits that utilize low voltages and small differential voltages are well understood by those skilled in the art. Circuit designers can consider the magnitude and ramifications of process variation effects and implement designs appropriately, such as matching device sizes and matching physical layout when possible. Techniques to improve signal integrity and to reduce excess capacitance can provide faster and more robust designs. Such techniques can support a greater number of bit cell states and thus provide greater memory capacity for a given device substrate area.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   receiving a first signal indicative of information stored at a first bit cell;
   receiving a second signal indicative of information stored at a second bit cell;
   receiving a third signal indicative of information stored at a third bit cell; and
   comparing the first signal, the second signal, and the third signal to each other to determine a first value stored at a memory;
   wherein determining the first value comprises determining the first value during a read phase, a magnitude of the first signal and a magnitude of the second signal decaying during the read phase.

2. The method of claim 1, further comprising:
   receiving a fourth signal indicative of information stored at a fourth bit cell; and
   wherein determining the first value comprises determining the first value based upon a comparison of the first signal, the second signal, the third signal, and the fourth signal to each other.

3. The method of claim 1, wherein comparing the first signal, the second signal, and the third signal comprises:
   ranking a magnitude of the first signal, a magnitude of the second signal, and a magnitude of the third signal relative to each other, the first value based on the ranking.

4. The method of claim 1, wherein the first signal is based upon a body charge of a transistor of the first bit cell.

5. The method of claim 1, wherein the first bit cell comprises a transistor having a selectable threshold voltage, the first signal based upon a selected threshold voltage of the transistor.

6. The method of claim 1, wherein the information stored at the first bit cell is based upon a programmed state of the first bit cell, the programmed state of the first bit cell selected from a number of available states, the number of available states greater than two.

7. The method of claim 6, wherein the number of available states is greater than three.

8. The method of claim 1, further comprising refreshing information at the first bit cell based upon the first value.

9. The method of claim 1, wherein the first signal is a voltage signal.

10. The method of claim 1, wherein the first signal is a current signal.

11. The method of claim 1, further comprising:
    receiving a fourth signal indicative of information stored at a fourth bit cell;
    receiving a fifth signal indicative of information stored at a fifth bit cell;
    receiving a sixth signal indicative of information stored at a sixth bit cell; and
    determining a second value stored at a memory based upon a comparison of the fourth signal, the fifth signal, and the sixth signal.

12. The method of claim 1, wherein a magnitude of the first signal decays at a first rate and the magnitude of the second signal decays at a second rate, the first rate substantially the same as the first rate.

13. A method, comprising:
    receiving a plurality of signals from a plurality of bit cells, the plurality of signals comprising three or more signals, each of the plurality of signals having a corresponding magnitude indicative of a state of a corresponding bit cell;

determining a ranking based upon the corresponding magnitude of each of the plurality of signals, the ranking indicating the corresponding magnitude of each of the plurality of signals relative to each other; and determining a value stored at a memory based upon the ranking;

wherein determining the value comprises determining the value during a read phase, the plurality of signals decaying during the read phase.

14. The method of claim 13, wherein each of the plurality of signals is based upon a body charge of a transistor associated with the corresponding bit cell.

15. The method of claim 13, further comprising refreshing a state of the plurality of bit cells based upon the value.

16. The method of claim 13, wherein the plurality of bit cells comprises a first bit cell, a state of the first bit cell programmed at one of number of available states greater than two.

17. The method of claim 13, wherein the plurality of bit cells comprises at least four bit cells, and the value comprises at least 24 binary bits.

18. A device, comprising:
a first bit cell comprising an output configured to provide a first signal indicative of information stored at the first bit cell;
a second bit cell comprising an output configured to provide a second signal indicative of information stored at the second bit cell;
a third bit cell comprising an output configured to provide a third signal indicative of information stored at the third bit cell; and
a comparison module comprising a first input coupled to the output of the first bit cell, a second input coupled to the output of the second bit cell, a third input coupled to the output of the third bit cell, and an output configured to provide a value based upon a comparison of the first signal, the second signal, and the third signal to each other
wherein the comparison module provides the value during a read phase, a magnitude of the first signal and a magnitude of the second signal decaying during the read phase.

19. The device of claim 18, wherein the information stored at the first bit cell is different from the information stored at the second bit cell and the information stored at the third bit cell, and wherein the information stored at the second bit cell is different than the information stored at the third bit cell.

* * * * *